US006404225B1

(12) United States Patent
Rangasayee

(10) Patent No.: US 6,404,225 B1
(45) **Date of Patent: *Jun. 11, 2002**

(54) INTEGRATED CIRCUIT INCORPORATING A PROGRAMMABLE CROSS-BAR SWITCH

(75) Inventor: Krishna Rangasayee, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/705,585

(22) Filed: Nov. 2, 2000

Related U.S. Application Data

(63) Continuation of application No. 09/139,960, filed on Aug. 25, 1998, now Pat. No. 6,181,159, which is a continuation-in-part of application No. 08/951,090, filed on Oct. 15, 1997, now Pat. No. 6,069,903.

(60) Provisional application No. 60/044,019, filed on May 6, 1997, and provisional application No. 60/064,429, filed on Oct. 30, 1997.

(51) Int. Cl.[7] .................................................. G06F 7/38

(52) U.S. Cl. .............................. 326/39; 326/37; 326/41

(58) Field of Search .............................. 326/37, 38, 39, 326/41

(56) References Cited

U.S. PATENT DOCUMENTS

| | | | | |
|---|---|---|---|---|
| 4,740,917 A | | 4/1988 | Denis et al. | |
| RE34,363 E | | 8/1993 | Freeman | |
| 5,455,525 A | * | 10/1995 | Ho et al. | 326/41 |
| 5,498,975 A | | 3/1996 | Cliff et al. | |
| 5,550,782 A | | 8/1996 | Cliff et al. | |
| 5,559,747 A | | 9/1996 | Kasamizugami et al. | |
| 6,060,903 A | * | 5/2000 | Rangasayee | 326/39 |

FOREIGN PATENT DOCUMENTS

| | | |
|---|---|---|
| EP | 0 612 154 A1 | 8/1994 |

OTHER PUBLICATIONS

Bursky, Dave, "Combination RAM/PLD Opens New Application Options", Electronic Design, pp. 138–140, May 23, 1991.

Intel Corporation "10 ns FLEXlogic FPGA with SRAM Option", Intel®, iFX780, pp. 2–24 to 2–46, Nov. 1993.

Ngai, Tony Kai–Kit, "An SRAM–Reconfigurable Field–Programmable Memory", Department of Electrical Engineering, University of Toronto, Thesis for Master of Applied Science, 1994.

* cited by examiner

*Primary Examiner*—Michael Tokar
*Assistant Examiner*—Anh Tran
(74) *Attorney, Agent, or Firm*—Beyer Weaver & Thomas LLP

(57) ABSTRACT

An integrated circuit operable in a plurality of switching modes is disclosed. The integrated circuit includes a plurality of direct connectors and a programmable switch unit operable in a plurality of switching modes. The programmable switch unit has a plurality of bi-directional I/O ports selectively connected by way of programmable switch unit internal connectors. The integrated circuit also includes a programmable function unit directly connected to the programmable switch unit by way of the direct connectors. The programmable function unit is programmable configured to operate as required by a selected one of the plurality of switching modes. As required by the selected one of the plurality of switching modes, the programmable function unit directs the programmable switch unit to form internal connections using the programmable switch unit internal connectors such that the programmable switch unit passes signals between selected portions of the plurality of bi-directional I/O ports.

17 Claims, 12 Drawing Sheets

INTEGRATED CIRCUIT INCORPORATING A PROGRAMMABLE CROSS-BAR SWITCH

CROSS REFERENCE TO RELATED APPLICATIONS

This application is a Continuation application of prior application Ser. No. 09/139,960 filed on Aug. 25, 1998 now U.S. Pat. No. 6,181,159 and entitled "INTEGRATED CIRCUIT INCORPORATING A PROGRAMMABLE CROSS-BAR SWITCH", the disclosure of which is incorporated herein by reference which is also a continuation-in-part of U.S. application Ser. No. 08/951,090 filed Oct. 15, 1997 now U.S. Pat. No. 6,060,903 and entitled "PPROGRAMMABLE LOGIC DEVICE ARCHITECTURE INCORPORATING A DEDICATED CROSS-BAR SWITCH" which is hereby incorporated by reference and which also claims benefit of priority under 35 U.S.C. §119(e) of (i) U.S. Provisional Application No. 60/044,019, filed May 6, 1997. This application also claims benefit of U.S. Provisional Application No. 60/064,429, filed Oct. 30, 1997 entitled "SWITCH—PLD HIGH PERFORMANCE PROGRAMMABLE LOGIC ARCHITECTURE" which is hereby incorporated by reference.

BACKGROUND OF THE INVENTION

1. Field of the Invention

The present invention relates generally to the field of integrated circuits, and more particularly, integrated circuits having switching capabilities.

2. Description of the Related Art

A programmable logic device or PLD is a programmable integrated circuit that allows the user of the circuit, using software control, to customize the logic functions the circuit will perform. The logic functions previously performed by small, medium, and large-scale integration integrated circuits can instead be performed by programmable logic devices. When an integrated circuit manufacturer supplies a typical programmable logic device, it is not yet capable of performing any specific function. The user, in conjunction with software supplied by the manufacturer or created by the user or an affiliated source, can program the PLD to perform the specific function or functions required by the user's application. The PLD then can function in a larger system designed by the user just as though dedicated logic chips were employed. For the purpose of this description, it is to be understood that a programmable logic device refers to once programmable as well as re-programmable devices.

Programmable logic encompasses all digital logic circuits configured by the end user, including field programmable gate arrays (FPGAs) and complex programmable logic devices (CPLDs). FIG. 1A is an illustration of a CPLD 100 known as embedded array programmable logic. The general architecture of the embedded array programmable logic device will be generally familiar to those knowledgeable of the FLEXIOK™ logic family of devices manufactured by the Altera Corporation of San Jose, Calif. Such an architecture is described in U.S. Pat. No. 5,550,782 and *Altera* Data Book 1998, which are incorporated herein by reference. Although only a few logic array blocks or memory blocks are illustrated, it should be appreciated that any number may be provided in order to meet the needs of a particular system.

Using the described embedded array type architecture, logic functions may be formed from each logic array block, or LAB, and various memory/logic functions may be formed from each embedded array block, or EAB. Each EAB and LAB may be programmably coupled to a plurality of vertical and horizontal conductors by appropriately situated associated programmable connectors such that an array capable of performing complex logic as well as complex logic/memory operations is formed. Each EAB includes an array of memory cells capable of operation as either a random access memory, static random access memory, dynamic access memory, or other configurations suitable for a desired application.

As an example, LAB 102 may be electrically coupled to a horizontal conductors 174 and 176 by programmable connectors 180 and 182, respectively and vertical conductors 190 and 194 by programmable connectors 184 and 186, respectively. In a similar fashion each of the array of EABs may be electrically coupled to at least one of each of the plurality of vertical and horizontal conductors. By way of example, EAB 104 may be electrically coupled to vertical conductors 190 and 191 by way of programmable connectors 195 and 197, respectively, and horizontal conductors 174 and 176 by way of programmable connectors 193 and 199, respectively. In this way, an embedded array programmable logic device capable of implementing complex logic and combined logic/memory functions is formed.

Cross-bar switches are commonly used in networking applications, such as switched LAN and ATM. Cross-bar switching schemes are also commonly used in telecommunications, networking, digital signal processing and multiprocessing systems. The basic building block in these switching schemes is an N input–N output (N×N) cross-bar switch 150 as illustrated in FIG. 1B. The N×N cross-bar switch 150 is capable of passing data between any one of a first plurality of the N bi-directional ports 152 to any one of a second plurality of N bi-directional ports 154.

Cross-bar switches perform many different tasks in addition to signal routing. For example, in some switching architectures, the destination address is embedded in the packetized data that is being rerouted. These switches perform address stripping and translation, assign routing channels, and may even provide some buffering for data packets.

Because cross-bar switches contain functionality in addition to pure signal routing, they are usually implemented as ASICs (Application Specific Integrated Circuits). An ATM (Asynchronous Transfer Mode) switch used extensively in networks such as LANs, WANs, and the Internet is but one example of a cross bar switch containing functionality. In the case of the ATM switch cited, such functionality may include Quality of Service (QoS) and traffic control functions in addition to the more conventional signal routing associated with a cross bar switch.

Unfortunately, cross-bar switches implemented as ASICs have several disadvantages. One such disadvantage is the time-to-market risks associated with the relatively long cycle time necessary for the implementation of a new ASIC design. An additional disadvantage with the use of ASICs for cross bar switches is the fact that ASIC based cross-bar switches cannot be used for re-configurable applications since ASICs are "hardwired" and must be redesigned for any new application.

In view of the foregoing, it is advantageous and therefore desirable to have available a programmable logic device which is capable of being user selected to perform complex logic functions in concert with or independent of cross-bar switch based signal routing and processing functions.

SUMMARY OF THE INVENTION

The invention relates to an integrated circuit that is operable in a plurality of switching modes is disclosed. The integrated circuit includes a plurality of direct connectors and a programmable switch unit operable in a plurality of switching modes. The programmable switch unit has a plurality of bi-directional I/O ports selectively connected by way of programmable switch unit internal connectors. The integrated circuit also includes a programmable function unit directly connected to the programmable switch unit by way of the direct connectors. The programmable function unit is programmably configured to operate as required by a selected one of the plurality of switching modes. As required by the selected one of the plurality of switching modes, the programmable function unit directs the programmable switch unit to form internal connections using the programmable switch unit internal connectors such that that programmable switch unit passes signals between selected portions of the plurality of bi-directional I/O ports.

In another aspect of the invention, a programmable logic device operable as a programmable switching device is disclosed. The programmable logic device includes a plurality of interconnection lines and a plurality of bi-directional input/output (I/O) ports that can be connected to external circuitry. The programmable logic device also includes a programmable function block that can be programmably connected to the plurality of bi-directional I/O ports via the plurality of interconnection lines. The programmable logic device also includes a programmable switch unit having a first plurality of I/O lines and a second plurality of I/O lines such that a selected portion of the first plurality of I/O lines can be directed by the programmable function block as needed to connect with a selected portion of the second plurality of I/O lines. In this way, that signals can pass between the selected portions of the first and the second plurality of I/O lines as required by programmable switching device.

The advantages of the invention are numerous. One advantage of the-invention is the increased routability that results due to the more efficient use of a limited number of memory resources. By using less die area for the placement of memory resources, the available die area for the inclusion of additional routing and/or memory and logic elements is increased. Another advantage is that the risk of fitting a logic function with unacceptable performance problems caused by circuitous routing is substantially reduced since the logic blocks and the memory blocks, for example, are located in closer physical proximity than would be available in conventional CPLD architectures. Consequently, the increased flexibility enables the CPLD to fit more complex logic functions more often than possible with conventional CPLD architectures.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DESCRIPTIONS OF THE PREFERRED EMBODIMENTS

In the following description, numerous specific details are set forth in order to provide a thorough understanding of the present invention. It will be apparent, however, to one skilled in the art, that the present invention may be practiced without some or all of these specific details. In other instances, well known components or operations have not been described in detail in order to not unnecessarily obscure the present invention.

Figure 1A:
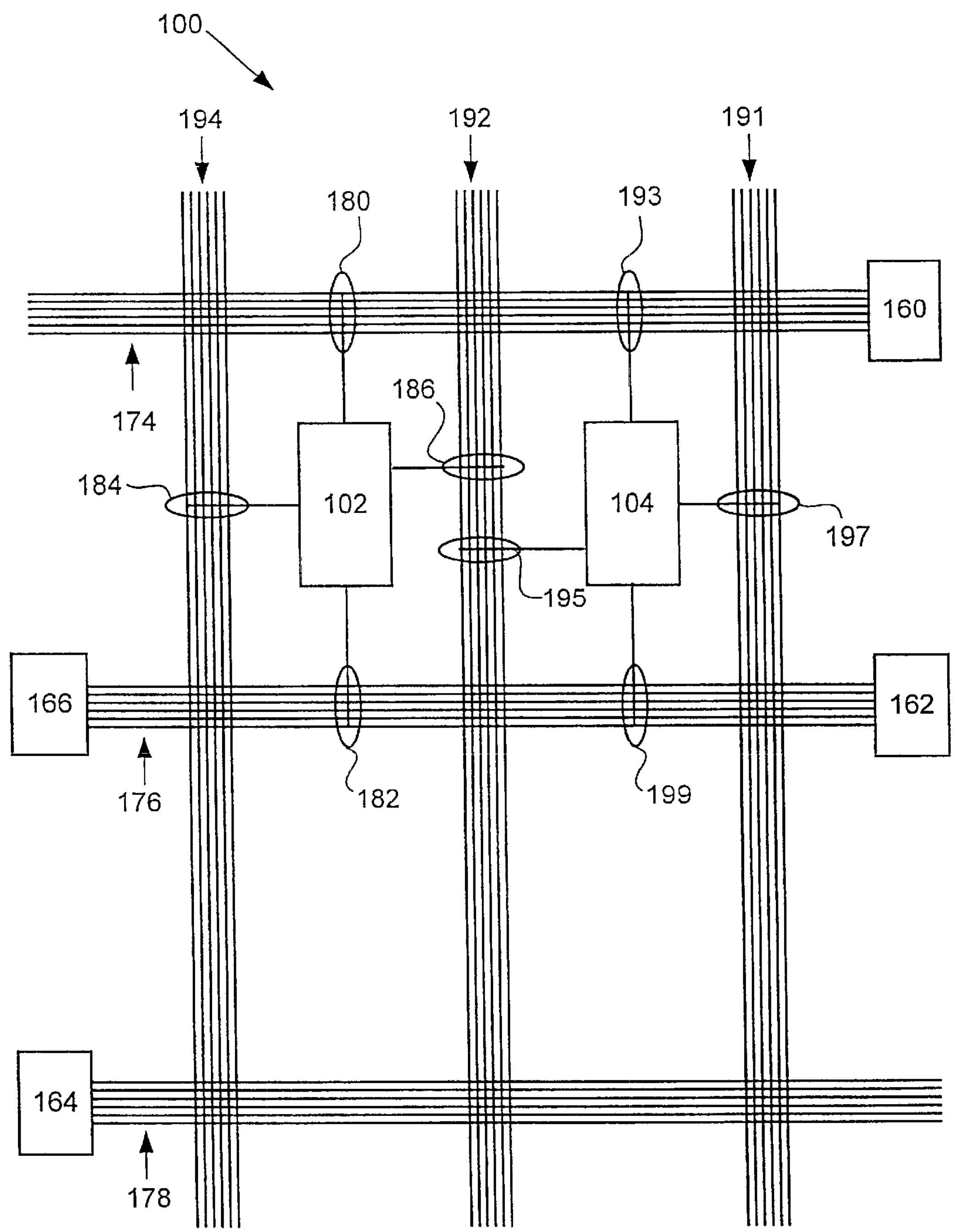
FIG. 1A is a block diagram of embedded array type programmable logic device architecture illustrating an embedded array block and a logic array block coupled to horizontal and vertical conductors by way of associated programmable connectors.
Figure 1B:
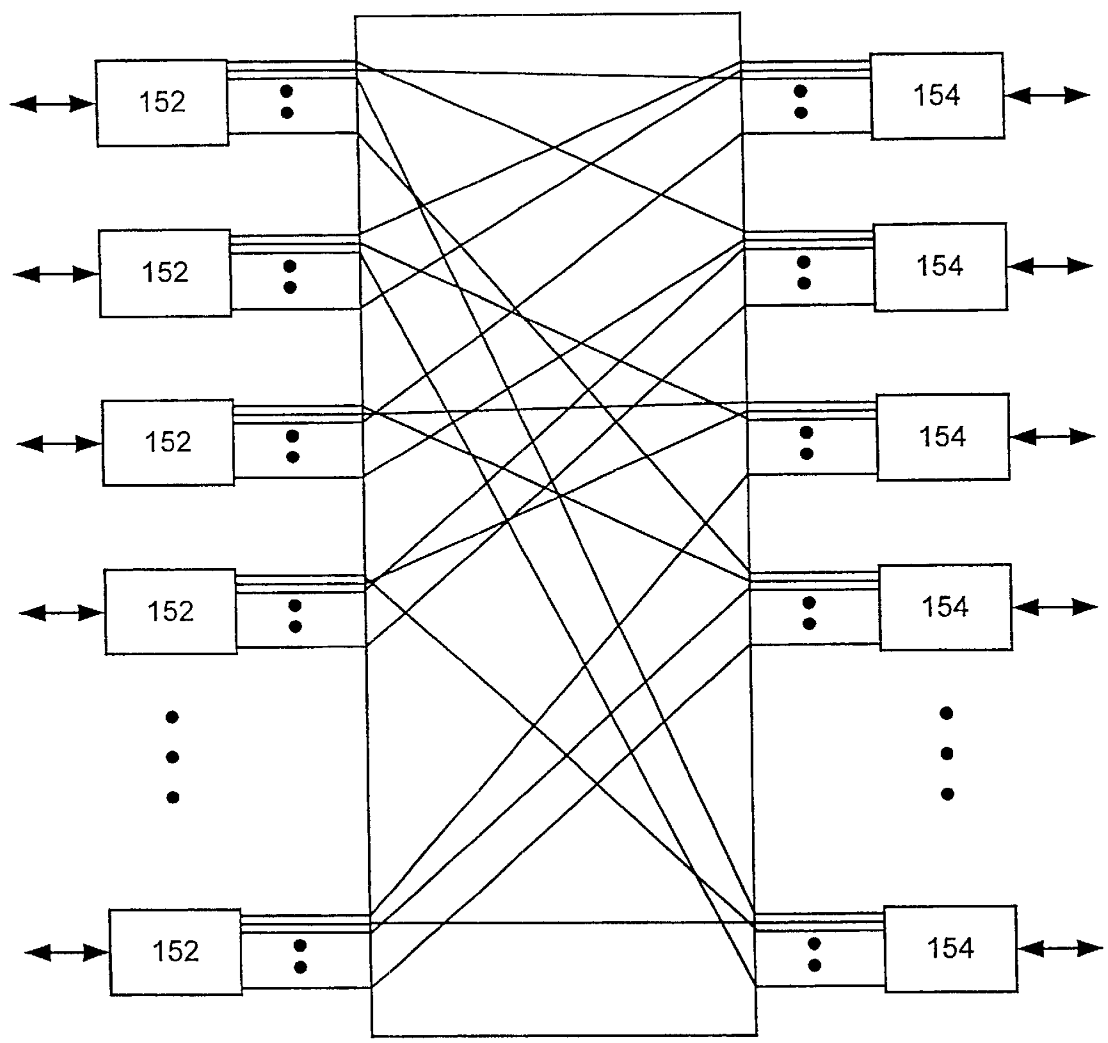
FIG. 1B is an illustration of an N×N cross-bar switch having a first plurality of N bi-directional ports selectably coupled a second plurality of N bi-directional ports.
Figure 2:
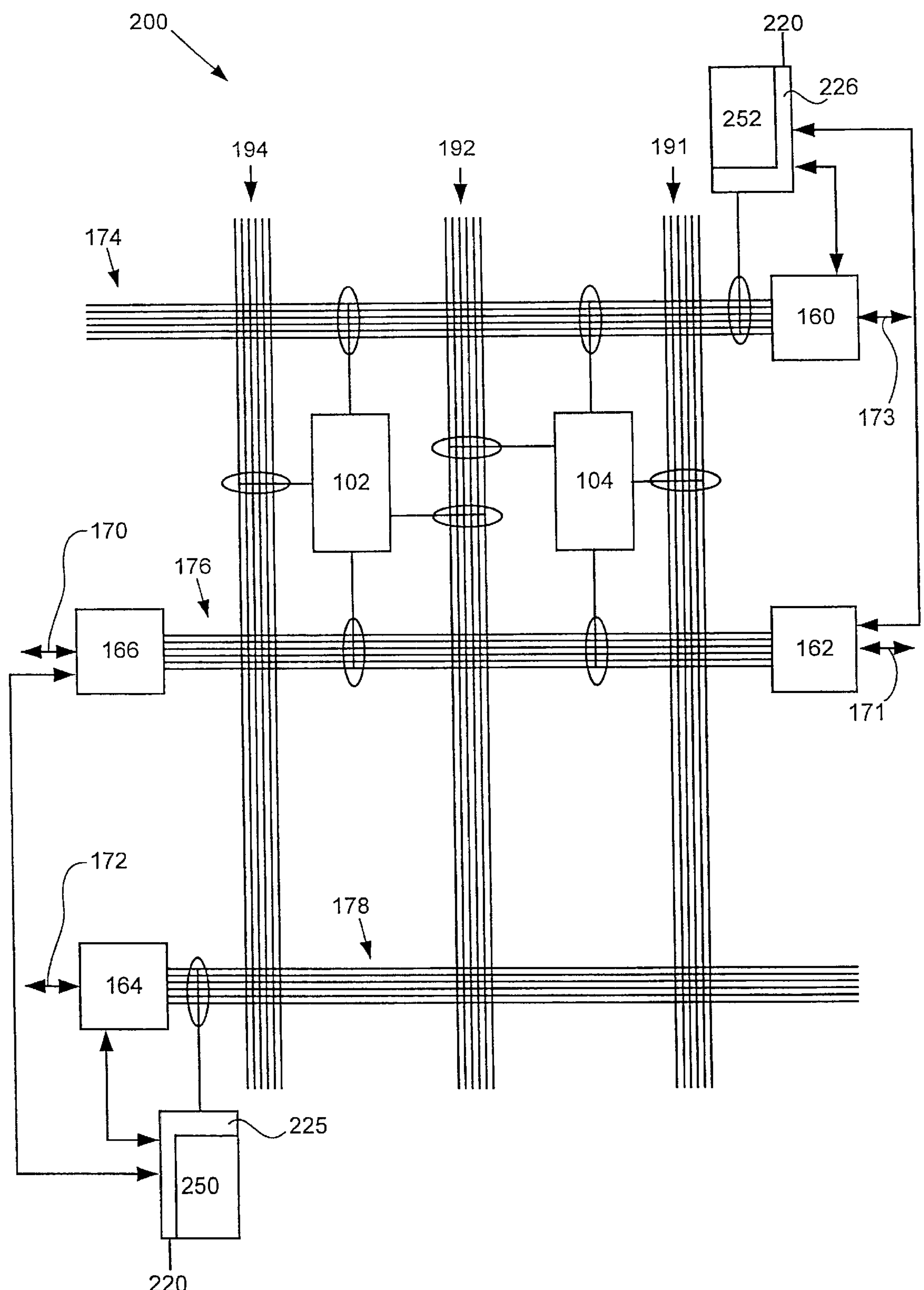
FIG. 2 is a functional block diagram of an embedded array type programmable logic device architecture incorporating an interface cross-bar switch block having an associated isolation circuit in accordance with a preferred embodiment of the invention.
Figure 3:
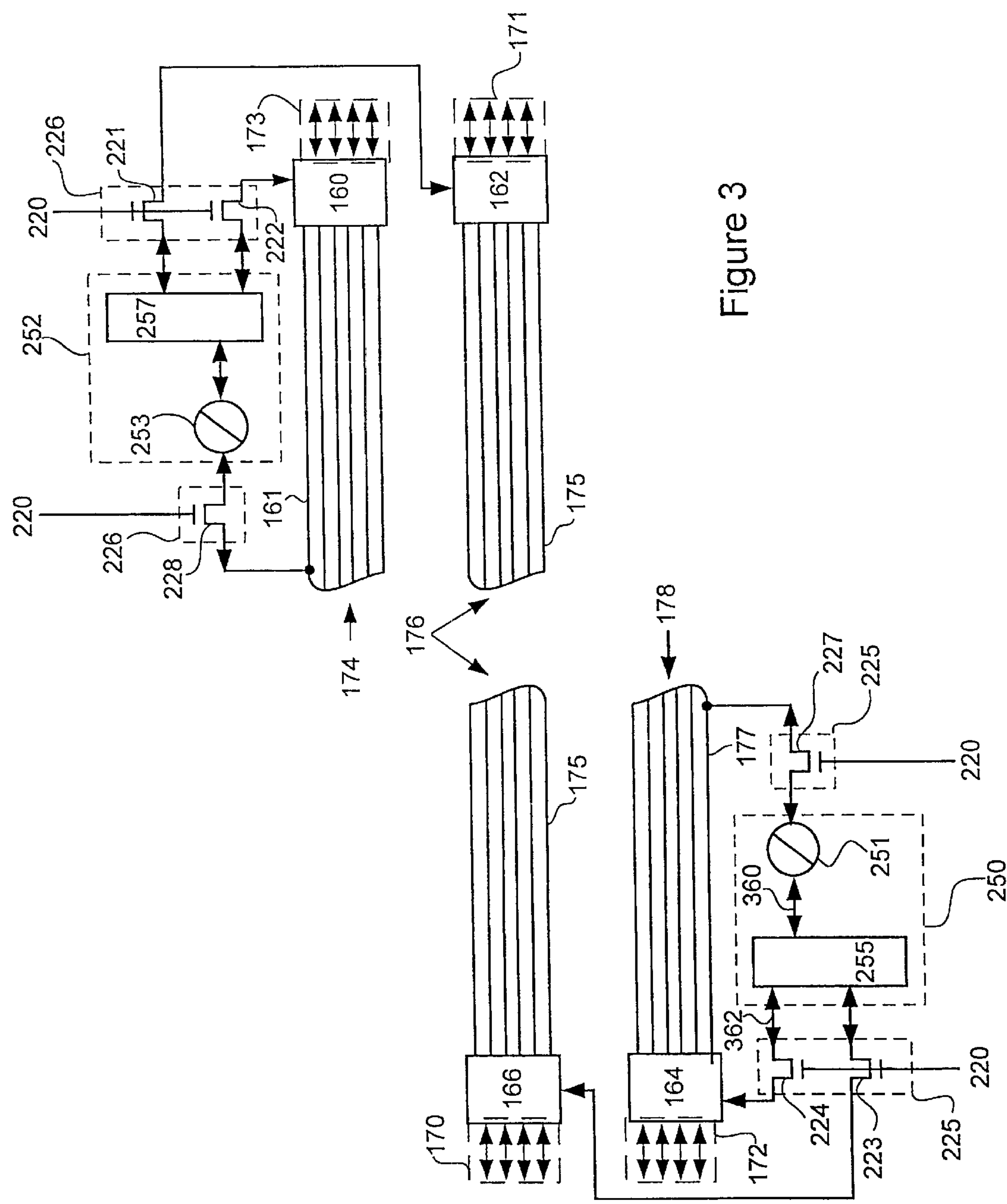
FIG. 3 is a schematic diagram of programmable logic device architecture incorporating an embedded interface cross-bar switch block having an associated isolation circuit as illustrated in FIG. 2.

Referring initially to FIG. 2 and FIG. 3, an embedded array type programmable logic device architecture incorporating an interface cross-bar switch in accordance with an embodiment of the invention will be described. FIG. 2 is a functional block diagram of an embedded array type complex programmable logic device CPLD 200. CPLD 200 includes an array of logic blocks 102 programmably coupled to horizontal conductors 174 and 176 as well as vertical conductors 191 and 194. CPLD 200 also includes an associated memory block 104 programmably coupled to a plurality of conductors which include horizontal conductor 174 and horizontal conductor 176 as well as vertical conductor 192 and vertical conductor 19 1. In this embodiment, each of the array of logic blocks 102 may include a plurality of logic cells (not shown).

For clarity of discussion, the cross-bar switch blocks described are for illustrative purpose only and it should be understood that any number of cross-bar switch blocks may be included within CPLD 200.

In the described embodiment, an interface cross-bar switch block 250 is selectably coupled to a bi-directional PLD ROW I/O 166 and a bi-directional PLD ROW I/O 164 by way of a first plurality of bi-directional ports 360. Interface cross-bar switch block 250 may also be selectably coupled to horizontal conductor 178 by way of a second plurality of bi-directional ports 362. In this manner, interface cross-bar switch block 250 may be selectably coupled to the array of logic blocks 102 and memory block 104. In one embodiment, each of the bi-directional PLD ROW I/Os may be coupled to a tri-stateable output driver which is enabled and disabled by a control signal. When enabled, the tri-state driver drives a data signal with a low impedance. Alternatively, when the tri-state driver is disabled the output driver assumes a high impedance state. In another embodiment, data buffers included within each of the PLD ROW I/Os may each be coupled to a clock signal generator such that the programmable logic device may be capable of operation in a synchronous as well as an asynchronous mode.

An associated isolation circuit 225 is disposed to electrically couple cross-bar switch block 250 to the array of logic blocks 102 and the memory block 104 in a user selectable first mode. Alternatively, in a user selectable second mode, isolation circuit 225 acts to electrically de-couple cross-bar switch block 250 from the array of logic blocks 102 and memory block 104. In a preferred embodiment, isolation circuit 225 is coupled to and activated by a mode control circuit switch 220.

In the described embodiment, an interface cross-bar switch block 252 includes a first plurality of bi-directional ports 364 selectably coupled to a bi-directional PLD ROW I/O 166 and a bi-directional PLD ROW I/O 164. Interface cross-bar switch block 252 may also include a second plurality of bi-directional ports 366 selectably coupled to horizontal conductor 174. In this manner, cross-bar switch block 252 may be selectably coupled to the array of logic blocks 102 and memory block 104 by way of bi-directional PLD ROW I/O 160 and bi-directional PLD ROW I/O 162 or horizontal conductor 174.

An isolation circuit 226 is disposed to electrically couple cross-bar switch block 252 to the array of logic blocks 102 and the memory block 104 in the first mode. In the second mode, isolation circuit 226 acts to electrically de-couple cross-bar switch block 252 from the array of logic blocks 102 and the memory block 104. Isolation circuit 226 is also coupled to and activated by mode control circuit switch 220.

Referring now to FIG. 3, PLD ROW I/O 164 may include a plurality of PLD I/Os 172 electrically coupled to a plurality of bi-directional row channels 177 included within horizontal conductor 178. Each of the plurality of row channels 177 may pass data independently of or in conjunction with other ones of the plurality of bi-directional row channels 177 included within the associated horizontal conductor 178 LD ROW I/O 166 may include a plurality of PLD I/Os 170 electrically coupled to a plurality of bi-directional row channels 175 included within horizontal conductor 176. Similarly, PLD ROW I/O 162 may include a plurality of PLD I/Os 171 electrically coupled to the plurality of bi-directional row channels 177 included within horizontal conductor 176. PLD ROW I/O 160 may include a plurality of PLD I/Os 173 electrically coupled to a plurality of bi-directional row channels 161 included within horizontal conductor 174.

In the described embodiment, isolation circuit 225 includes a transistor 223 having a source coupled to PLD ROW I/O 166 and a drain coupled to the plurality of bi-directional ports 362. A transistor 224 has a source coupled to PLD ROW I/O 164 and a drain coupled to the plurality of bi-directional ports 362 of interface cross-bar switch block 250. Isolation circuit 225 also includes a transistor 227 having a source coupled to row channel 177 and a drain programmably coupled by way of programmable cross-bar switch block connector 251 to the plurality of bi-directional ports 360. The gates of transistor 223, transistor 224 and transistor 227 are each coupled to mode control circuit switch 220.

In the first mode, mode control circuit switch 220 supplies a first mode signal $V_{1mode}$ to the gates of transistors 223, 224, and 227 such that each of the transistors 223, 224, and 227 becomes substantially conducting. In this way, interface cross-bar switch block 250 is electrically coupled to the array of logic blocks 102 and the memory block 104. Alternatively, in the second mode, mode control switch circuit 220 supplies a second mode signal$V_{2mode}$,de t0 the gates of transistors 223, 224, and 227 such that each transistor becomes substantially non-conducting. In this way, cross-bar switch block 250 is electrically de-coupled from the array of logic blocks 104 and the memory block 104.

In the described embodiment, isolation circuit 226 includes a transistor 222 having a source coupled to PLD ROW I/O 160 and a drain coupled to first interface cross-bar switch block 252 by way of the plurality of bi-directional ports 366. A transistor 221 has a source coupled to PLD ROW I/O 162 and a drain coupled to first interface cross-bar switch block 252. Isolation circuit 225 also includes a transistor 228 having a source coupled to row channel 161 and a drain programmably coupled to interface cross-bar switch block 252. The gates of transistor 223, insistor 224 and transistor 227 are each coupled to mode control circuit switch 220.

In the described embodiment, isolation circuit 226 acts in an analogous manner as isolation circuit 225 to electrically couple cross-bar switch block 252 from the array of logic cells in the first mode and de-couple in the second mode.

Interface cross-bar switch block 250 includes a dedicated associated programmable connector 251 suitably disposed to selectably couple row channel 177 to selected ones of the second plurality of bi-directional ports 360. Interface cross-bar switch block 250 also includes a cross-bar switch unit 255 suitable for selectably passing data from selected ones of the first plurality of bi-directional ports 362 to selected ones of the second plurality of bi-directional ports 360.

Similarly, interface cross-bar switch block 252 includes dedicated associated programmable connector 253 suitably disposed to selectably couple row channel 161 to selected ones of a plurality of bi-directional ports 364. Interface cross-bar switch block 252 also includes a cross-bar switch unit 257 suitable for selectably passing data from selected ones of the first plurality of bi-directional ports 364 to selected ones of the second plurality of bi-directional ports 366.

Figure 4:
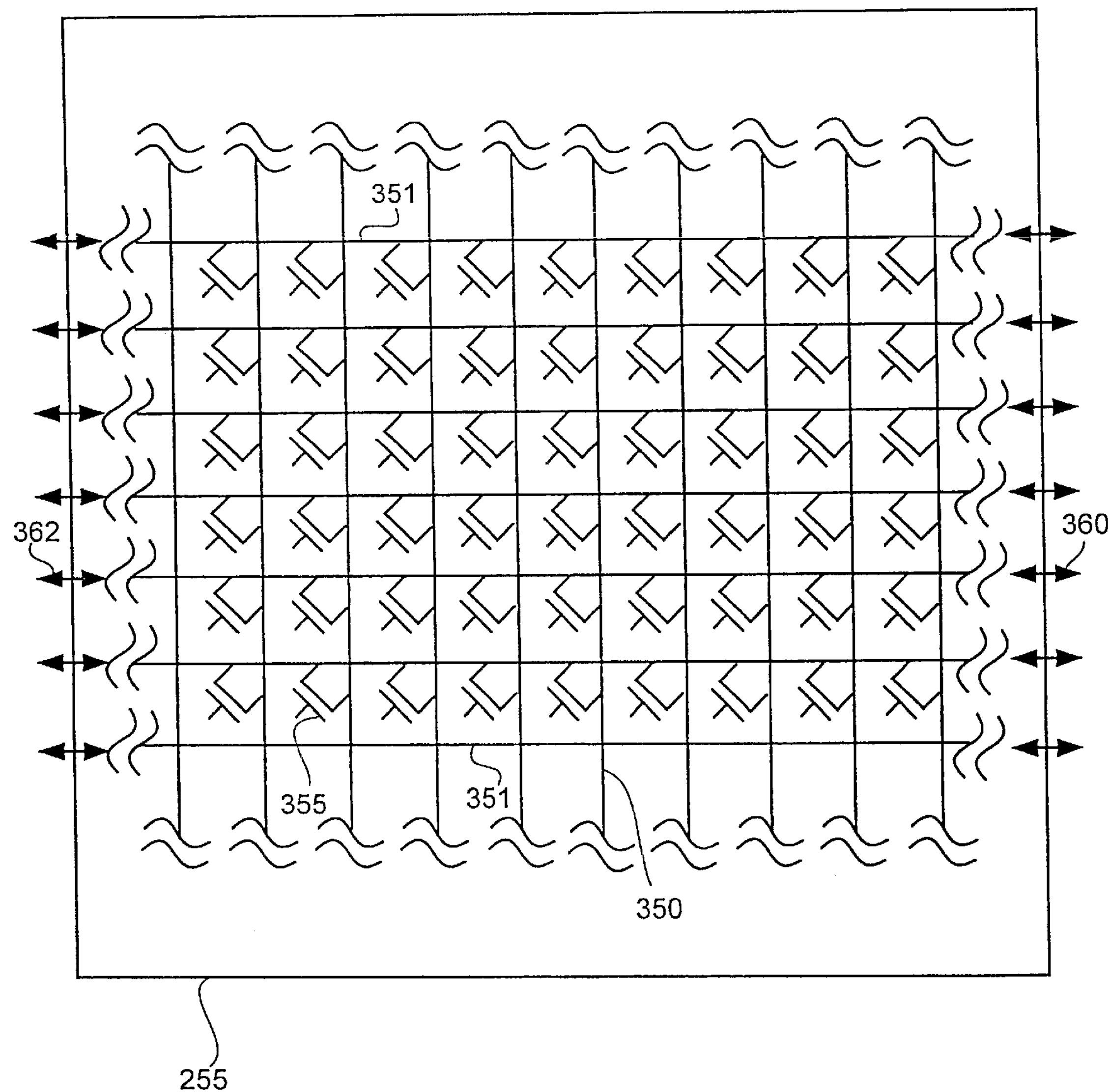
FIG. 4 is a schematic diagram of a cross-bar switch unit illustrating an array of cross-bar switch unit connectors programmably interconnecting a plurality of horizontal and vertical data lines so as to couple selected bi-directional ports in accordance with an embodiment of the invention.

In the described embodiment, the cross-bar switch unit 255 may take on any suitable configuration. By way of example, referring to FIG. 4, cross-bar switch unit 255 includes a plurality of vertical data lines 350 programmably connected by way of a plurality of programmable cross-bar unit connectors 355 to a plurality of horizontal data lines 351. Selected ones of the plurality of programmable cross-bar unit connectors 355 act to programmably couple selected vertical data line 350 and selected horizontal data line 351. In this manner, selected ones of the plurality of bi-directional ports 360 may be coupled to selected ones of the plurality of bi-directional ports 362.

Figure 5:
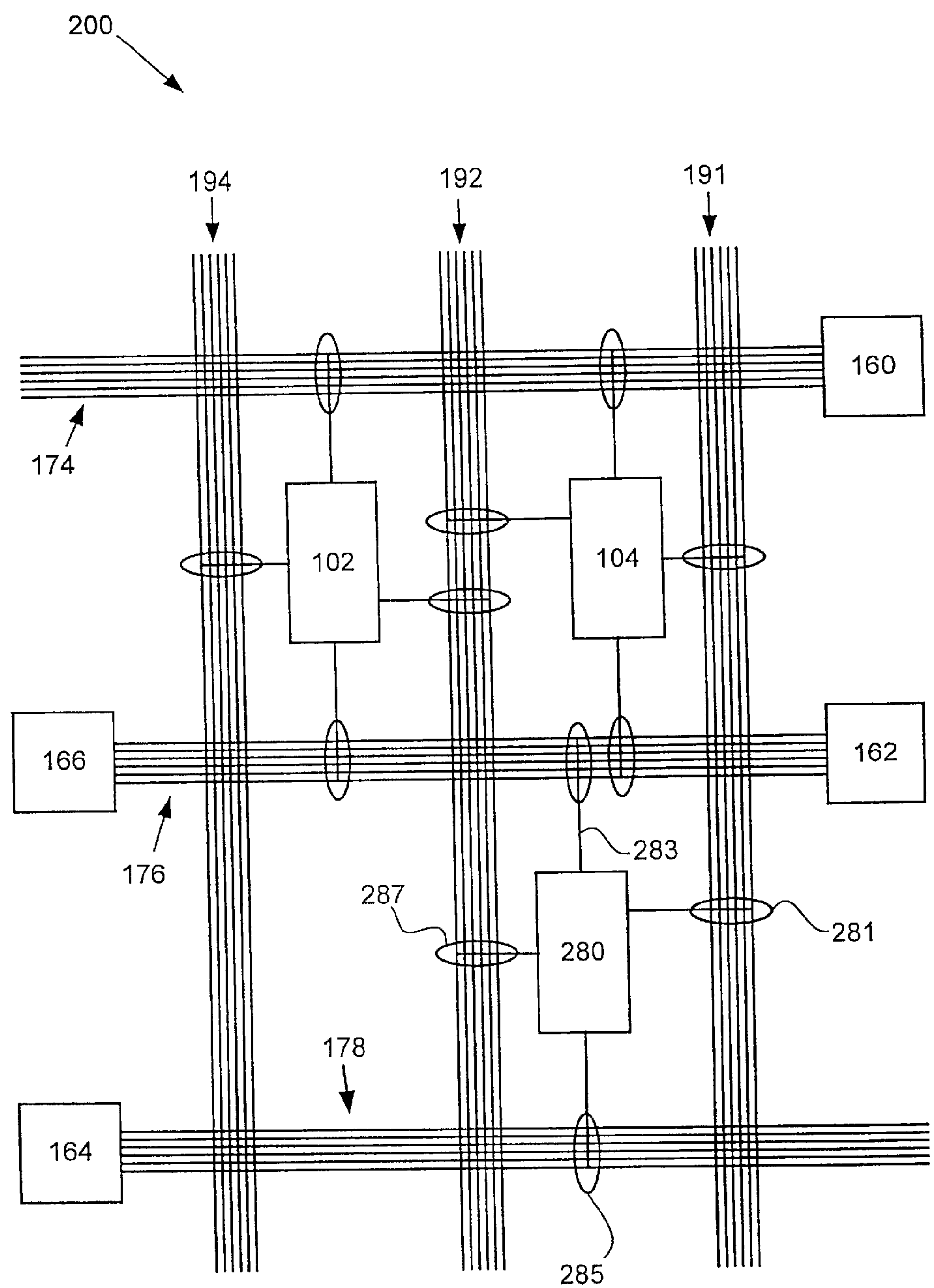
FIG. 5 is a functional block diagram of an embedded array logic type programmable logic device architecture incorporating an embedded kernel cross-bar switch block in accordance with an embodiment of the invention.

An advantage CPLD 200 is its ability to be repeatedly configured to perform different complex logic functions. This ability to configure desired complex logic functions is accomplished by selectively coupling various LABs (and the logic elements contained therein) included within CPLD 200. Implementation of complex logic function in CPLD 200, referred to as fitting, may require the interconnection of several LABs (and in some cases certain of the EABs) included within CPLD 200. In some cases, the LABs and/or EABs required to fit the logic or logic/memory function may be located in disparate portions of CPLD 200 core area further increasing the need of internal routing and programming resources. A kernel cross-bar switch block 280 as presented in FIG. 5 substantially increases the available internal routing and programming resources available to CPLD 200. In this manner, the capability of CPLD 200 to fit complex logic and logic/memory functions efficiently is substantially increased.

As shown, kernel cross-bar switch block 280 may be selectively connected to any of a plurality of bi-directional column channels 290 included within vertical conductor 191 by way of dedicated kernel cross-bar connectors 281. Kernel cross-bar switch block 280 may also be selectively connected to any of a plurality of bi-directional column channels 291 included within vertical conductor 192 by way of dedicated kernel cross-bar connectors 287. In the described embodiment, kernel cross-bar switch 280 may be programmably connected to horizontal conductor 178 by way of dedicated kernel cross-bar connectors 285 as well as horizontal conductor 176 by way of dedicated kernel cross-bar switch connectors 283. In this way, the number and variety of programmable internal routing paths suitable for fitting, complex logic and logic/memory functions may be significantly increased.

Figure 6:
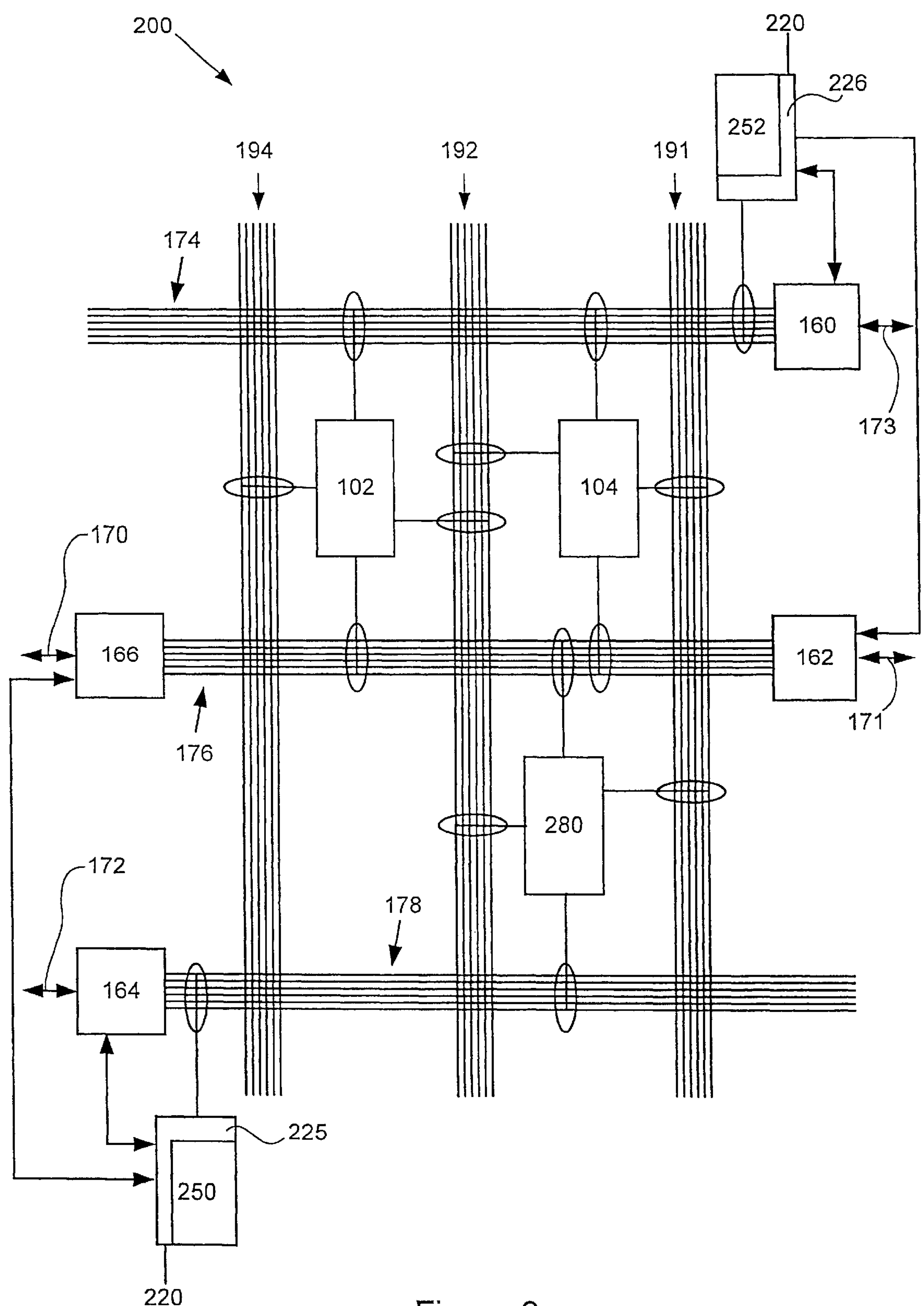
FIG. 6 is a functional block diagram of an embedded array type programmable logic architecture having a kernel cross-bar switch block and an interface cross-bar switch block in accordance with another embodiment of the invention.

FIG. 6 is a functional block diagram of programmable logic architecture incorporating both kernel cross-bar switch block 280 and interface cross-bar switch blocks 250 and 252 in accordance with an embodiment of the invention. In this embodiment, a user may be capable of selectively coupling any row channel with any column channel without substantially using the programming or routing resources allocated to the array of logic blocks 102 or the memory block 104. By way of example, a signal path from PLD ROW I/O 164 to PLD 162 may be formed simply by appropriately configuring kernel cross-bar switch block 280 to couple horizontal conductor 178 to horizontal conductor 176. In this manner, a great number of possible internal interconnects are available without substantially increasing the complexity of routing software or amount of programming resources required.

Figure 7:
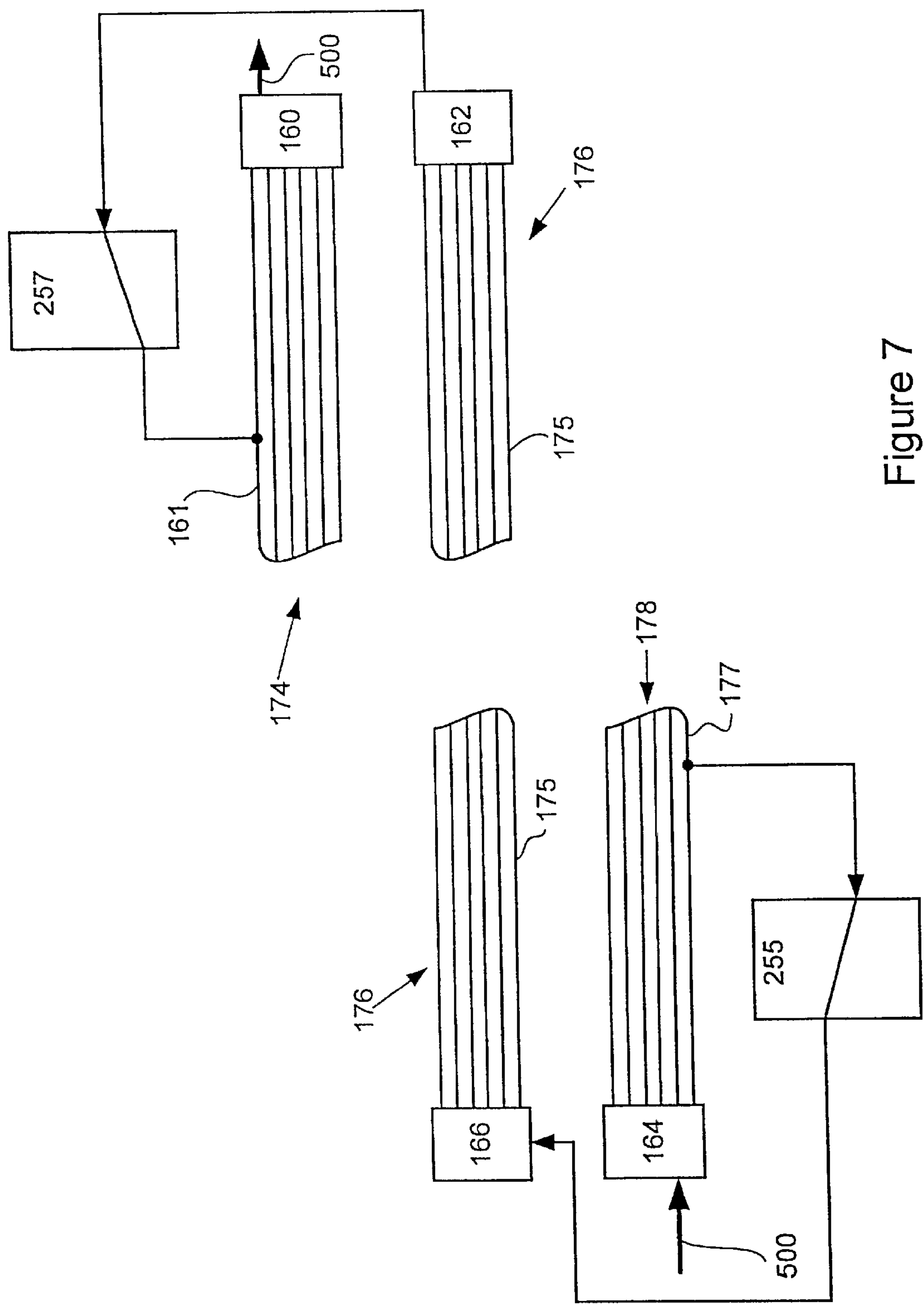
FIG. 7 is a schematic diagram of an embedded array type programmable logic architecture as shown in FIG. 2 configured to operate as a re-configurable full cross-bar switch.

FIG. 7 is a schematic diagram of an embedded array type programmable logic architecture as shown in FIG. 2 configured to operate as a re-configurable global cross-bar switch. A signal 500 is supplied to PLD ROW I/O. Mode control circuit switch 220 supplies first mode signal $V_{1mode}$ to isolation circuit 225 such that interface cross-bar switch 250 is electrically connected to PLD ROW I/O 164 and 166 by way of bi-directional nodes 362. In an analogous manner, mode control circuit switch 220 supplies first mode signal $V_{1mode}$ to isolation circuit 226 such that interface cross-bar switch block 252 is electrically connected to PLD ROW I/O 160 and 162.

Programmable interface cross-bar switch block connector 251 may be configured to form a conductive path from row channel 177 to interface cross-bar switch block 250 such that signal 500 may be an input to cross-bar switch block 250. Appropriately configured, cross-bar switch 250 then passes signal 500 to PLD ROW I/O 164 which is electrically coupled to PLD ROW I/O 162 by way of row channel 175. In an analogous manner to isolation circuit 225, isolation circuit 226 electrically connects PLD ROW I/O 162 and PLD ROW I/O 160 to an input of cross-bar switch block 252. Appropriately configured, interface cross-bar switch 252 then passes signal 500 to row channel 161 by way of programmable cross-bar connector 253. Row channel 161 then passes signal 500 to PLD ROW I/O 160.

Figure 8:
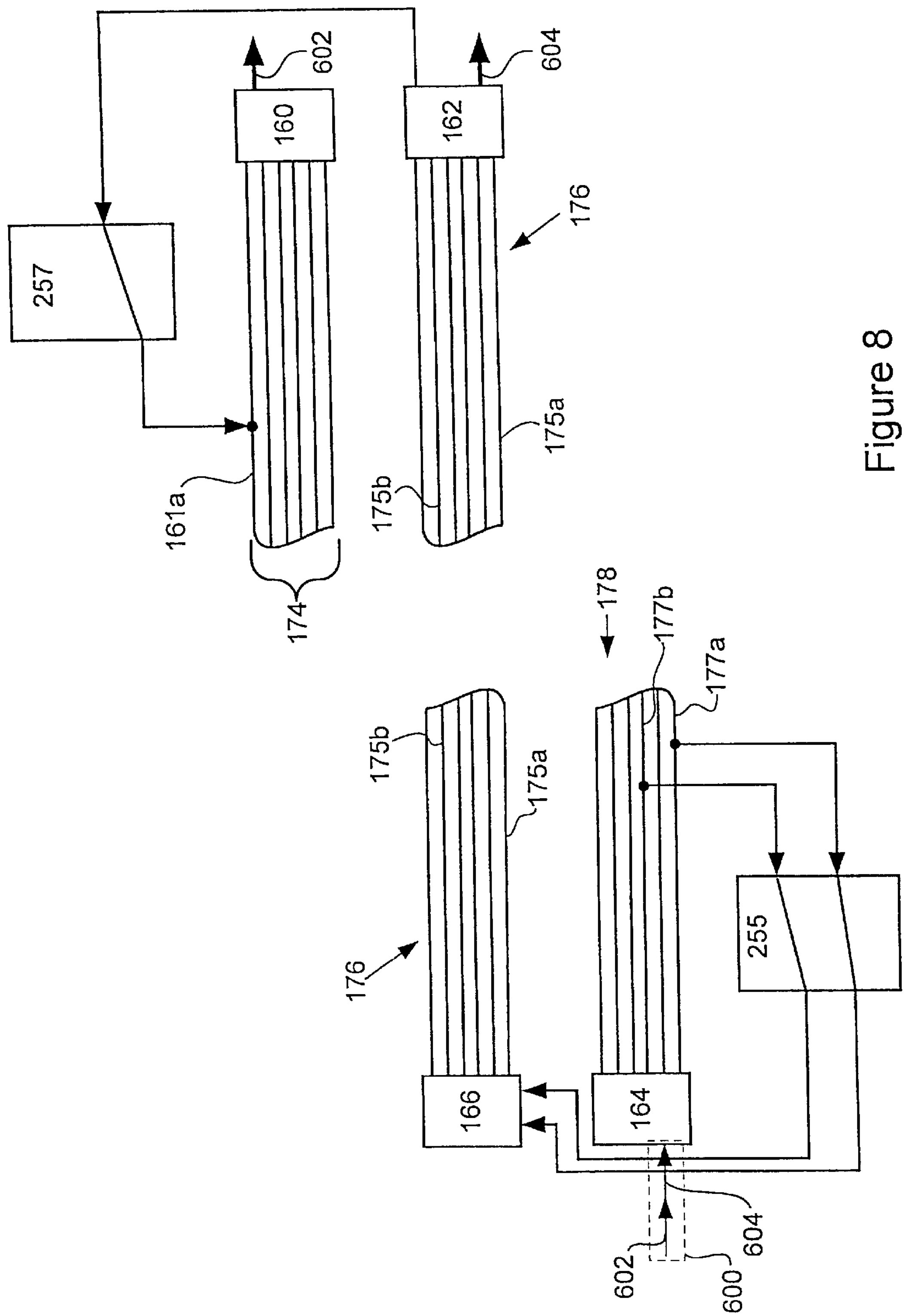
FIG. 8 is a schematic diagram of an embedded array type programmable logic architecture as shown in FIG. 2 configured to operate as a parallel to serial converter.

FIG. 8 is a schematic diagram of an embedded array type programmable logic architecture as shown in FIG. 2 configured to operate as a serial to parallel signal converter. A serial signal 600 includes data packets 602 and 604 supplied to PLD ROW I/O 164. Serial signal 600 may, for example, represent an input from an asynchronous transmission mode (ATM) traffic generator (such as a fax or modem) wherein data packets 602 and 604 may each represent different "calls" each being associated with a plurality of ATM data cells. In the described embodiment, a multiplexer (not shown) included within PLD ROW I/O 164 is capable of passing data packet 602 to row channel 177*a* and data packet 604 to row channel 177*b*. As discussed above, mode control circuit switch 220 acts to couple interface cross-bar switch 250 to PLD ROW I/O 164 and 166 and interface cross-bar switch block 252 to PLD ROW I/O 160 and 164.

Programmable interface cross-bar switch block connector 251 is configured to form a conductive path from row channels 177*a* and 177*b* to selected ones of the bi-directional ports 362 of interface cross-bar switch block 250. Appropriately configured, cross-bar switch 250 passes each data packet 602 and 604 to row channels 175*a* and 175*b*, respectively, included within PLD ROW I/O 164. In the described embodiment, each of the row channels 175*a* and 175*b* is electrically coupled to PLD ROW I/O 162 such that data packet 604 may form an input to and be stored within a synchronous data register (not shown) included within PLD ROW I/O 162. Substantially simultaneously, interface cross-bar switch 252, appropriately configured, then passes data stream 602 to row channel 161 by way of programmable crossbar connector 253. Row channel 161 then passes data stream 602 to PLD ROW I/O 160 thereby converting serial data signal 600 into parallel data signals 602 and 604.

In yet another embodiment of the invention, a programmable cross bar switch unit can be integrally interconnected with a group of memory cells as well as a group of logic cells by way of a plurality of programmable interconnects. So connected, an integrated circuit capable of operation in a number of switching modes as well as logic and/or memory modes can be formed. The integrated circuit typically takes the form of a complex programmable logic device (CPLD). In one embodiment, the group of logic cells can take the form of a logic array block (LAB) and the memory block can be arranged in a manner deemed appropriate by the application being fitted by the CPLD.

High speed data transmission often requires high speed switching operations. For example, Asynchronous Transmission Mode (ATM) circuits typically include high speed data transmission switches, referred to as ATM switches, that generally require large blocks of data be stored in memory. This memory must be capable of accommodating data of varying lengths for varying periods of time. ATM switching techniques are well known in the art and described, for example, in David Ginsburg, "ATM: solutions for enterprise internetworking", 1st Edition, Addison Wesley Publishing Company 1996. The ATM switch must also be capable of rapidly directing ATM cells between a single source I/O port and a single destination I/O port (referred to as a unicast transmission) along what is referred to as a virtual circuit.

In some situations, a CPLD configured to operate as an ATM switch must rapidly direct ATM cells between multiple source I/O ports and multiple destination I/O ports (referred to as multicast transmission). It is therefore desirable that the CPLD operable as an ATM switch, for example, possess the capability of reconfiguring any blocks of memory and any programmable switch unit as needed. In one embodiment, the reconfiguring can be directed by the group of logic cells that can take the form of a logic array block (LAB). In another embodiment, the reconfiguring can be directed by a processor system capable of executing programming instructions directed at the formation of and/or destruction of the virtual circuit. In another embodiment, the reconfiguring can be directed by external circuitry by way of bi-directional I/O ports integrally connected to the memory block and/or the programmable switch unit.

Applications, such as an ATM switch, that require the CPLD to reconfigure many of it constituent elements within relatively short time period, typically cannot tolerate slow critical data paths within the CPLD. One of the many advantages of integration includes the capability of forming relatively short data paths within the CPLD that can help prevent slow data paths from forming. These relatively short data paths can also result in more efficient utilization of valuable programming resources required to form these data paths. In one embodiment, these programming resources can include memory cells included in the memory block. In another embodiment, programming resources can include memory cells included within the CPLD but not included in the memory block. In this way the memory cells included within the memory block can be preserved for use by the application being fitted. The efficient use of the valuable programming resources also provides for higher probability of fitting functions, such as logic functions, memory functions, logic-memory functions, and/or switching functions by the CPLD without substantially sacrificing data storage capacity.

Figure 9:
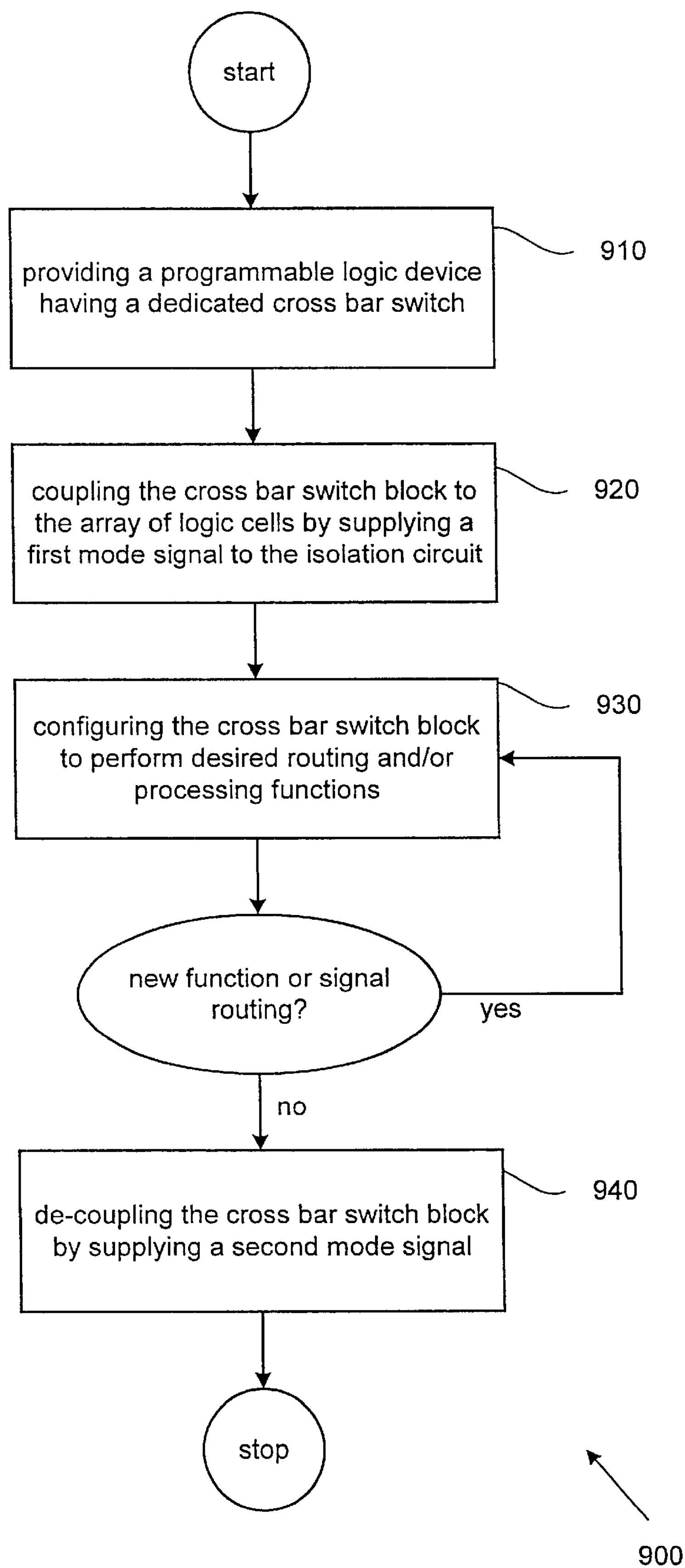
FIG. 9 is a block diagram of a programmable switch device in accordance with another embodiment of the invention.

FIG. 9 is a block diagram of a programmable switch device 400 in accordance with another embodiment of the invention. The programmable switch device 400 includes a programmable function unit 402 integrally connected by way of interconnects 404 to a programmable switch unit 406. The programmable switch unit 406 can be connected to external circuitry via a bi-directional I/O bus 405. The programmable switch unit 406 can be directed by the programmable function unit 402 to send and to receive signals (such as, control or data signals) to or from selected nodes via the bi-directional I/O bus 405. In one embodiment, the programmable switch unit 406 can take the form of a cross-bar switch.

The programmable switch device 400 also includes a system clock unit 408 capable of providing appropriate clock signals to the programmable function unit 402 and the switch unit 406 by way of the interconnects 404. In this way, the programmable switch device 400 can operate in a synchronous mode. In one embodiment, the system clock unit 408 can be implemented as a phase lock loop (PLL) device.

Figure 10:
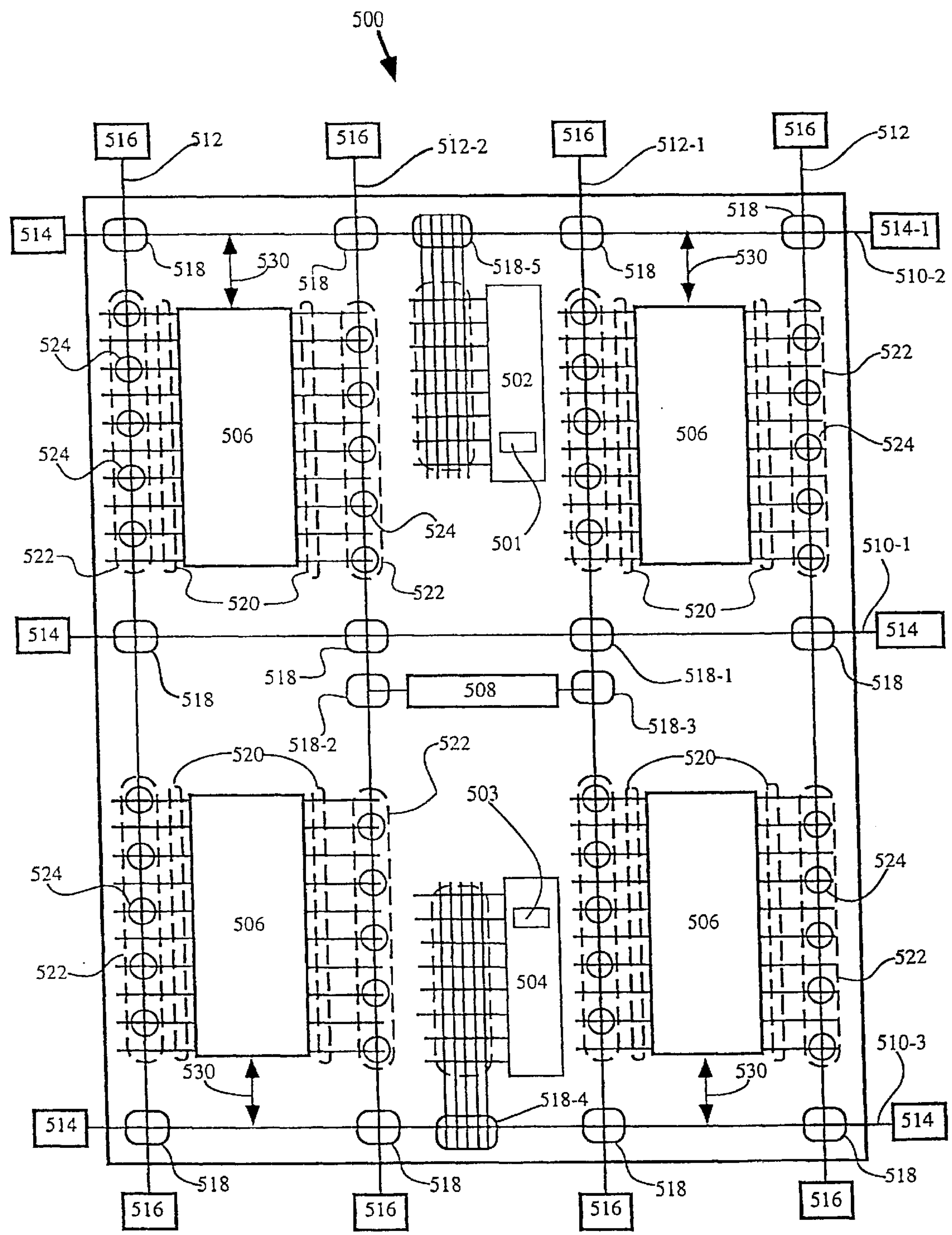
FIG. 10 is a schematic diagram of a CPLD operable as a programmable switch device in accordance with another embodiment of the invention.

It should be noted the programmable switch device 400 can be implemented as part of an integrated circuit. The integrated circuit typically takes the form of a complex programmable logic device (CPLD). FIG. 10 is a schematic diagram of a CPLD 500 operable as a programmable switch device in accordance with another embodiment of the invention. In one implementation, the logic block LB 502 can include a look up table (LUT) device or any other such device or element deemed suitable for generating appropriate logic functions. In another implementation, the logic block LB 502 can take the form of a logic array block having logic elements suitable for generating simple logic functions such as the logic array block 102 discussed above. In yet another implementation, the logic block LB 502 can have logic cells 501 that generate desired logic functions using combinatorial logic and/or tri-state logic, for example.

The CPLD 500 can include a first function block operable as a logic block LB 502 having logic cells 501 each of which are capable of forming simple logic functions. The CPLD 500 can also include a second function block operable as a memory block NM 504 having a group of memory cells 503 each of which are capable of storing data in either a volatile or non-volatile manner. In one implementation, the memory block MB 504 can take the form of an embedded array block such as the embedded array block 104 described above.

In the described embodiment, the memory cells 503 included in the memory block MB 504 can be appropriately arranged and of sufficient quantity to accommodate data words suitable for use in, for example, high speed data transmission applications. One such high speed data transmission application for which the invention is well suited is the Asynchronous Transmission Mode (otherwise referred to as ATM) switch. As described above, the ATM switch must, for example, be capable of rapidly directing ATM cells associated with a call between a single source I/O port and a single destination I/O port (unicast) along what is referred to as a virtual circuit. By virtual circuit it is meant a path by which the ATM cells associated with the call must follow through the ATM switch. The ATM switch must also be capable of accommodating different calls having different transmission protocols, for example, by rapidly reconfiguring appropriate elements included in the CPLD 500. Such elements can include the logic block LB 502 as well as the memory block MB 504.

The CPLD 500 also includes global horizontal conductors 510 that couple to horizontal bi-directional I/O ports 514 and global vertical conductors 512 that couple to vertical bi-directional I/O ports 516. In one embodiment, the bi-directional I/O ports 514 and the bi-directional I/O ports 516 can connect to external circuitry that provides programming signals, for example, derived from automatic place and route software. Such route and place software (i.e., MAX+ PLUS II™ developed by the Altera Corporation of San Jose, Calif., discussed above) can fit desired logic, logic-memory, and/or switching functions in the CPLD 500.

The CPLD 500 further includes various programmable interconnect arrays (PIA) 518. The PIAs 518 can programmably connect the global horizontal conductors 510 to the global vertical conductors 512 or programmably connect other components within the CPLD 500 to either the horizontal conductors 510 or the global vertical conductors 512. By way of example, the global horizontal conductor 5 10-1 and the vertical conductor 512-1 can be connected together by way of the PIA 518-1. As another example, the memory block MB 507 can be connected to the global horizontal conductor 510-3 by the PIA 518-4.

Any one or more of programmable switch units 506 can be programmably interconnected to the logic block LB 502 as well as the memory block MB 504 by way of the global horizontal conductors 510 and the global vertical conductors 512 to form a programmable switch array. The programmable switch array can perform high speed switching operations independent of or in conjunction with logic and/or memory-logic functions deemed appropriate by the fitted application.

In the described embodiment of the CPLD 500 illustrated in FIG. 10, a system clock taking the form of the system clock unit 508 can be connected to any of the global horizontal conductors 5 10 and the global vertical conductors 512 by way of the PIAs 518. By way of example, the system clock unit 508 can be programmably connected to the global vertical conductor 512-1 and the global vertical conductor 512-2 using the PIA 518-3 and the PIA 518-2, respectively. The CPLD 500 can operate in a synchronous mode whenever the system clock unit 508 is operative and appropriately connected to the global vertical conductors 512 and/or the global vertical conductors 510. Alternatively, whenever the system clock unit 508 is not connected to any conductors, or is connected but otherwise inoperative, the CPLD 500 can operate in an asynchronous mode.

Furthermore, the CPLD 500 includes programmable interconnect regions 522. The programmable interconnect regions 522 can connect input/output (I/O) lines 520 (capable of carrying data and control signals) associated with the programmable switch units 506 to the vertical conductors 512, Each of the programmable interconnect regions 522 include programmable connectors 524 capable of interconnecting selected conductors as directed by programming resources. It should be noted that for the sake of clarity only a few of the programmable connectors 524 are shown within the programmable interconnect regions 522, whereas any suitable number can be included in the programmable interconnect regions 522. In one implementation, these programming resources can include selected ones of the memory cells 503, selected ones of the logic cells 501, or any appropriate combination thereof In another implementation, programming resources can include external circuitry cap able of generating programming signals that can be connected to any of the bi-directional I/O ports. Similarly, the logic block LB 502 can be programmably connected to the global horizontal conductor 510-2 by the PIA 518-5 and the memory block MB 504 can be programmably connected to the global horizontal conductor 510-3 using the PIA 518-4.

A signal bus 530 connects the global horizontal conductors 510 to the programmable switch units 506. Each of the signal busses 530 can pass signals (such as switch programming control signals, system clock signals, etc.) between the associated global horizontal conductor 510 and the associated programmable switching unit 506. The signals carried by the busses 530 can come from a variety of sources. In one implementation, the signals can be supplied to any of the global horizontal conductors 5 10, for example, by external circuitry connected to any of the bi-directional I/O ports 514 or any of the bi-directional I/O ports 516. By way of example, external circuitry connected to bi-directional I/O port 514-1 can supply appropriate signals to the signal bus 530 by way of the global horizontal conductor 510-1. In another implementation, the signals can be generated by the LB 502, for example, and supplied to the signal bus 530 via the global horizontal conductor 510-1.

In operation, the CPLD 500 can act in any number of desired modes. Such modes can include data switching functions independent of or in conjunction with logic and/or memory functions supplied by the LB 502 and the MB 504, respectively. The CPLD 500 can also operate as a non-switching CPLD by programmably disconnecting, or otherwise disabling, the programmable switch units 506. One application for which the described embodiment of the inventive CPLD is well suited is that associated with the high speed data switching already discussed.

Figure 11:
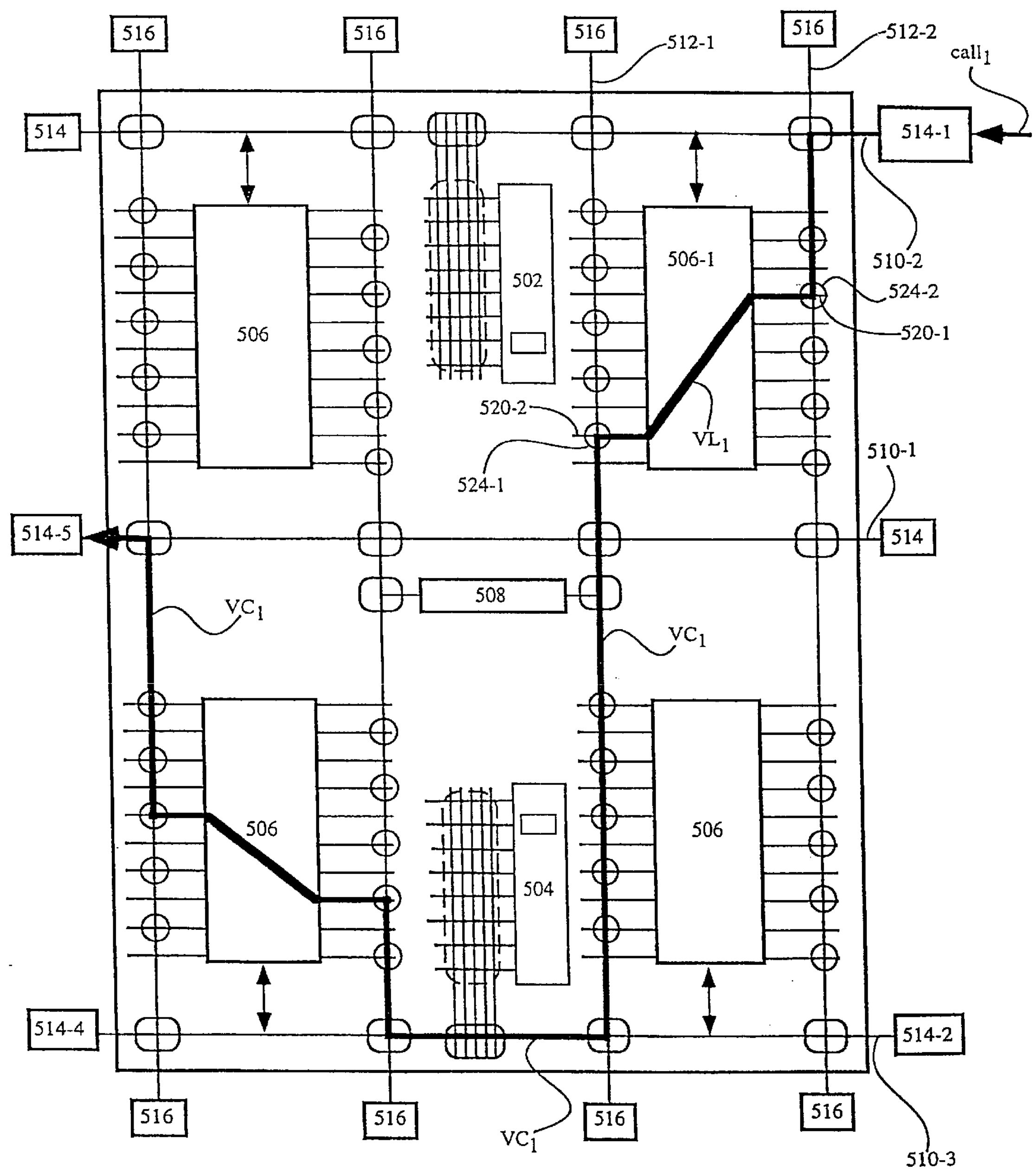
FIG. 11 is a circuit diagram of a CPLD configured to operate as a high speed data switch in accordance with an embodiment of the invention.

FIG. 11 is a circuit diagram of the CPLD 500 configured to operate as a high speed data switch in accordance with an embodiment of the invention. For this example, it is assumed that the high speed data switch is an ATM switch. However, it should be understood that the CPLD 500 is well suited for various types of data switching circuits. In the form of an ATM switch, the logic block 502 can supply any logic necessary to create a desired virtual circuit through the CPLD 500. Such logic can relate to traffic control, quality of service (QoS), and traffic shaping, for example. The virtual circuit formed within the CPLD 500 thereby provides a path by which all ATM cells associated with a call must follow. It should be noted that for sake of clarity only a unicast type ATM call is described herein. It should be appreciated that any appropriate type ATM call (unicast, multicast) can be implemented by the CPLD 500. By way of example, the bi-directional I/O port 514-1 and the bi-directional I/O port 514-5 represent a single source I/O port and a single destination I/O port, respectively, of a typical unicast call. The bi-directional I/O port 514-1 and the bi-directional I/O port 514-5 are coupled by way of a virtual circuit VC, The virtual circuit VC, provides a path by which all ATM cells associated with the call entering the single source bi-directional port 514-1 are directed to the single destination bi-directional port 514-5. It should be noted that in the described embodiment, the flow of ATM cells along the virtual circuit $VC_1$ is bi-directional in that the ports 514-1 and 514-5 are interchangeable with regards to source and destination. Alternatively, if more than one destination port was desired, as would be expected in a multicast-type ATM call, any of the other I/O ports could be selected.

FIG. 11 illustrates a specific example where the programmed circuitry within the CPLD 500 between the bi-directional port 514-1 and the bi-directional port 514-5 form the virtual circuit VC,. It should be noted that the VC, is but one of many possible virtual circuits between the bi-directional I/O ports 514-1 and 514-5 wherein each may communicate with external circuitry connected thereto. Such external circuitry can include, telephones, digital computers, televisions, etc.

The virtual circuit VC, connecting the bi-directional port 514-1 and the bi-directional port 514-5 can be formed during a call SET-UP procedure whereby external circuitry in the form of any of the communication devices listed above, for example, can transmit SET-UP signals to, for example, the bi-directional I/O port 514-1. In one embodiment, the SET-UP signal is then passed to the logic block LB 502 and/or the memory block MB 504 where appropriate logic functions and/or memory functions can be generated. Such logic functions can include QoS, traffic control, and traffic shaping functions related to maintaining the integrity of the transmission through the CPLD 500 of the ATM cells associated with the call.

In one embodiment, the SET-UP signal can supply appropriate programming signals to the programmable connectors 524. The SET-UP signal can also establish a portion of the virtual circuit $VC_1$ referred to as a virtual link VL. A virtual link VL through the programmable switch unit 506, for example, can be created by the LB block 502, for example, directing the programmable switch unit 506 to couple selected ones of the I/O lines 520. By way of example, a virtual link VL, can be created in the programmable switch unit 506-1 by coupling the I/O line 520-1 with the I/O line 520-2. The virtual link $VL_1$ can, in turn, be coupled to the global vertical conductor 512-1 by way of the programmable connector 524-1 and to the global vertical conductor 512-2 by way of the programmable connector 524-2. The virtual circuit $VC_1$ can then be completed by forming and subsequently coupling each of the virtual links VL created in the CPLD 500 at the behest of the SET-UP signal. Once the virtual circuit $VC_1$ is complete, the logic block LB 502, for example, can initiate the call by sending a SET-UP COMPLETE signal, for example, indicating that the virtual circuit $VC_1$ within the CPLD 500 associated with the call is complete.

It should be noted that if the CPLD 500 can operate in a synchronous mode, then the ATM switch can utilize any suitable number of virtual circuits VC each being associated with a particular group of ATM cells (or call). For example, during a system clock cycle $\mathbf{0}_1$, ATM cells associated with $CALL_1$ can pass along the virtual circuit $VC_1$, for example. During a system clock cycle $\mathbf{0}_2$, ATM cells associated with CALL2can pass along a virtual circuit$VC_2$ linking the bi-directional ports 514-2 and 514-4, for example. In this way, the CPLD 500 can greatly increase the amount of data transmitted as well as the speed by which the data is transmitted through the CPLD 500.

There are several advantages to integrally connecting the programmable switch unit to other function blocks included in the complex programmable logic device. One advantage is the increased routability that results due to the more efficient use of a limited number of memory resources. By using less die area for the placement of memory resources, the available die area for the inclusion of additional routing and/or memory and logic elements is increased. Another advantage is that the risk of fitting a logic function with unacceptable performance problems caused by circuitous routing is substantially reduced since the logic blocks and the memory blocks, for example, are located in closer physical proximity than would be available in conventional CPLD architectures. Consequently, the increased flexibility enables the CPLD to fit more complex logic functions more often than possible with conventional CPLD architectures.

Although the foregoing invention has been described in some detail for purposes of clarity of understanding, it will be apparent that certain changes and modifications may be practiced within the scope of the appended claims. It should be noted that there are may alternative ways of implementing the present invention. By way of example, in one embodiment, the programmable switch unit can be directed by either external circuitry or by appropriately configured function blocks included in the complex programmable logic device. In another embodiment, the programmable switch unit can be used in conjunction with the logic block and/or the memory block to implement (or fit) complex logic functions, logic/memory functions in conjunction with or independent of complex switching functions otherwise impracticable with more conventional CPLD architecture. It is therefore intended that the following appended claims be interpreted as including all such alterations, permutations, and equivalents as fall within the spirit and scope of the present invention.

What is claimed is:

1. A programmable switch array operable in a number of switching modes, comprising;

a plurality of horizontal connectors;

a plurality of vertical connectors;

a programmable switching unit having a plurality of cross connectable bi-directional I/O ports wherein the programmable switching unit further includes a programmable interconnect region having a plurality of direct programmable connectors arranged to connect selected ones of the bi-directional I/O ports to selected ones of the plurality of vertical connectors; and a programmable function unit operable in a number of logic-type function modes and/or a number of memory type function modes programmably connected to said programmable switch unit as directed, in part, by programming resources.

2. A programmable switch as recited in claim 1, further comprising:

a plurality of programmable interconnect arrays arranged to programmably connect selected ones of the plurality of vertical connectors to selected ones of the plurality of horizontal connectors.

3. A programmable switch as recited in claim 1, wherein the programmable function unit is one of a plurality of programmable function units each of which is independently programmable as a logic type function unit or a memory type function unit as needed.

4. A switch as recited in claim 3, wherein each of the plurality of programmed function units are programmably connected to one another, as needed, by way of selected ones of said global horizontal and vertical connectors in conjunction with selected ones of the plurality of programmable interconnect arrays as directed by the programming resources.

5. A switch as recited in claim 3, wherein each of the plurality of programmed function units are programmably connected to one another, as needed, by way of selected ones of programmable switching units in conjunction with said programmable interconnect arrays and said programmable interconnect regions as directed by the programming resources.

6. A switch as recited in claim 1, wherein the programmable function unit includes a number of logic cells arranged to perform a selected logic function and wherein the programmable function unit includes a number of memory cells arranged to perform selected memory functions.

7. A switch as recited in claim 2, wherein the programming resources include selected ones of the logic cells and selected ones of said memory cells.

8. A switch as recited in claim 2, wherein the programming resources includes external circuitry coupled to said switch.

9. A switch as recited in claim 1, wherein said switch is included in a first integrated circuit.

10. A switch as recited in claim 1, wherein said switch is a second integrated circuit.

11. A switch as recited in claim 9, wherein the first integrated circuit is a programmable logic device.

12. A switch as recited in claim 9, wherein the second integrated circuit is a programmable logic device.

13. In an integrated circuit having a dedicated cross bar switch unit and an array of programmable function cells, a method of coupling the dedicated cross bar switch unit to the array of logic cells by way of an isolation circuit, comprising:

(a) receiving a first mode signal at the isolation circuit;

(b) electrically coupling the dedicated cross bar switch unit to the array of. programmable function cells by the isolation circuit based upon the first mode signal wherein the programmable switch unit further includes a programmable interconnect region having a plurality of direct programmable connectors arranged to connect selected ones of the bi-directional I/O ports to selected ones of the plurality of vertical connectors;

(c) configuring the dedicated cross bar switch unit to perform a desired function;

(d) determining if a new desired function is to be performed;

(e) when it is determined that the new desired function is to be performed, repeating (c);

when it is determined that there is no new function to be performed, (f) receiving a second mode signal at the isolation circuit; and (g) de-coupling the dedicated cross bar switch unit from the array of logic cells based upon the second mode signal.

14. A method as recited in claim 13, wherein the integrated circuit is a programmable logic device.

15. A method as recited in claim 13, wherein the plurality of programmable function cells is a plurality of programmable logic cells arranged to perform a desired logic function.

16. A method as recited in claim 13, wherein the plurality of programmable function cells is a plurality of programmable memory cells arranged to perform a desired memory function.

17. A method as recited in claim 13, wherein the plurality of programmable function cells is a plurality of logic-memory cells arranged to perform logic, memory and logic-memory functions.

* * * * *